United States Patent [19]

Miller

[11] 4,365,251

[45] Dec. 21, 1982

[54] ELECTRICALLY DRIVEN METER TOTALIZING DEVICE

[75] Inventor: Robert C. Miller, Penn Hills Township, Allegheny County, Pa.

[73] Assignee: Westinghouse Electric Corp., Pittsburgh, Pa.

[21] Appl. No.: 213,692

[22] Filed: Dec. 4, 1980

[51] Int. Cl.³ .................... H04Q 9/00; G08C 19/16
[52] U.S. Cl. ............................. 340/870.02; 324/141
[58] Field of Search ............... 340/870.02, 870.19, 340/870.2, 870.31; 179/2 AM; 324/137, 139, 141, 142, 153; 310/49 R

[56] References Cited

U.S. PATENT DOCUMENTS

| | | |
|---|---|---|
| 2,428,882 | 10/1947 | Kolff . |
| 3,134,917 | 5/1964 | Miller . |
| 3,599,194 | 8/1971 | Lipscomb . |
| 3,733,493 | 5/1973 | McClelland . |
| 3,943,498 | 3/1976 | McClelland et al. . |
| 4,182,983 | 1/1980 | Heinrich et al. . |

*Primary Examiner*—Thomas A. Robinson
*Attorney, Agent, or Firm*—Robert E. Converse, Jr.

[57] ABSTRACT

A register is coupled to a rotor which is driven in stepped rotation by magnetic fluxes directed through electromagnetic pole pieces of a stator. The pole pieces carry coil windings which produce the magnetic fluxes by being sequentially and discretely energized by a circuit responsive to pulse signals, each pulse signal representing a quantum of a quantity to be measured.

8 Claims, 9 Drawing Figures

ELECTRICALLY DRIVEN METER TOTALIZING DEVICE

BACKGROUND OF THE INVENTION

1. Field of the Invention

This invention relates to meter totalizing devices and more particularly to dial registers driven in stepped rotation by electromagnetic pole pieces carrying coil windings which are sequentially energized in response to pulse signals.

2. Description of the Prior Art

Totalizing devices are designed to totalize the value of variable quantities such as the consumption of water, gas, or electricity. One specific device is provided by a watthour meter to measure and totalize AC electric energy consumption. In a conventional watthour meter, voltage and current magnetic sections produce alternating magnetic fluxes responsive to the line voltage and line current. The fluxes rotate an electroconductive disc which is in driving relationship with a dial register. Such a meter is well known as described in the *Electrical Metermen's Handbook*, seventh edition, Edison Electric Institute, 1965.

It is known to remotely meter AC electric energy consumption by a device responsive to pulse signals initiated from a conventional watthour meter. One example of such a device is disclosed in U.S. Pat. No. 3,599,194, assigned to the assignee of this invention. A pulse signal is initiated after each predetermined increment of rotation of the dial indicator corresponding to the lowest order of the decade related dials. Using a system of biased switches, the pulse signals energize a motor which rotates a corresponding dial indicator of a remote dial register a corresponding increment.

It is also known to electromagnetically produce stepped rotations in response to pulse signals. One example of this is disclosed in U.S. Pat. No. 3,134,917, wherein U-shaped electromagnets have north and south poles alternately positioned in a circular array. The fluxes produced by the energization of the electromagnets cause a back and forth motion in an adjacent rotor. The rotor motion is translated by a ratchet device into the stepped rotation of a shaft. A second example of electromagnetically producing stepped rotations in response to pulse signals is disclosed in U.S. Pat. No. 2,428,882. A soft magnetic iron armature has radially disposed teeth and is secured to a shaft. Flux producing field coils are arranged on several pole pieces which are adjacent the teeth. The coils are connected in series and are energized by pulse signals. As each pulse energizes the field coils and the coil fluxes attract adjacent teeth, a spring loaded mechanical element completes the movement of the armature and holds it in position for the next pulse.

The aforementioned prior art remote metering devices remotely totalize the value of the quantity being measured by using a specific arrangement of mechanical and magnetic switches which create pulse signals that drive a motor whereas the present invention remotely totalizes in response to pulse signals. Moreover, the aforementioned prior art electromagnetic devices must use ratchets or other mechanical devices to complete and hold their stepped rotation while the present invention does not need such devices.

SUMMARY OF THE INVENTION

In accordance with the present invention, an electrically driven meter totalizing device includes a dial register assembly having a gear train for rotating a plurality of dial indicators and a rotatable input for driving the gear train. The meter totalizing device further includes an electromagnetic drive system having a rotor for driving the rotatable input and further having a stator for producing stepped rotation of the rotor. The rotor includes an armature having at least three radially disposed evenly spaced equal magnetic segments. The stator includes a plurality of electromagnetic pole pieces with their ends defining magnetic poles adjacent the magnetic segments. Carried on each pole piece is a coil winding for producing magnetic fluxes therein so that each end of the pole piece magnetically attracts a magnetic segment. The pole pieces are arranged in a magnetically rotatably attractive relationship with the magnetic segments so that the energization of the coil windings in a predetermined sequence will attract successive magnetic segments to drive the rotor in stepped rotations. The meter totalizing device further includes a circuit for producing two levels of energization at each coil winding within the predetermined driving sequence. The circuit responds to an input of pulse signals to connect each winding to two different power sources, one source providing less power than the other. The power source providing the greater amount of power is used to attract the magnetic segments while the power source providing the lesser amount of power is used to hold the segments in place between pulses.

There are at least two alternative mounting positions for the electromagnetic drive system. The armature is either carried on a shaft engaged to the rotatable input or is directly engaged with the rotatable input, the stator being adjacent to the armature in either position. Furthermore, the number of electromagnetic pole pieces can be varied along with the shape and size of the openings in the armature, the openings spacing the magnetic segments in accordance with the magnetically rotatably attractive relationship previously mentioned.

There are at least three distinct applications of the present invention. First, it can be connected to a pulse producing electronic AC electric energy measuring circuit which replaces the voltage and current magnetic sections of a conventional watthour meter. Second, it can remotely register the quantity measured by a pulse initiating equipped consumption meter. Third, it can be used with a switching device to provide multirate metering.

A general feature of the present invention is that it is inexpensive and simple to manufacture and assemble.

A further feature of the present invention is that there is little likelihood that vibrations or externally induced forces will cause the register to operate incorrectly since one of the electromagnetic pole pieces is always energized and thus magnetically holding the armature in place.

A still further feature of the present invention is that it uses a minimal amount of electrical current to hold the armature in place.

A still further feature of the present invention is that it is not subject to error by tilting as is the meter disc of the conventional watthour meter because, as mentioned hereinabove, the armature is always held in place.

A still further feature of the present invention is that it does not require mechanical devices other than ordinary shafts and gears to complete the stepped rotation of its rotor.

A still further feature of the present invention is that it may be used for either direct metering, remote metering, or multirate metering. These and other advantages and features of the present invention will be apparent from the detailed description of the invention illustrated in the drawings briefly described hereinafter.

DESCRIPTION OF THE PREFERRED EMBODIMENT

Figure 2:
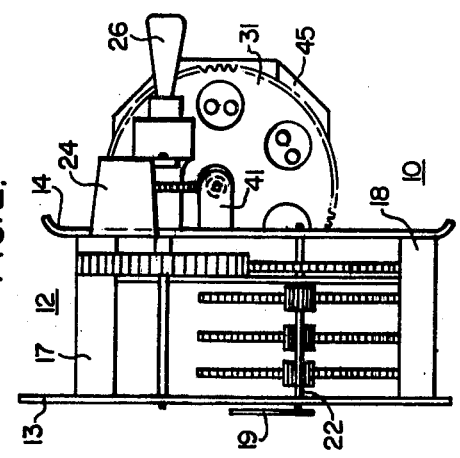
FIG. 2 is a side view of the device shown in FIG. 1.
Figure 1:
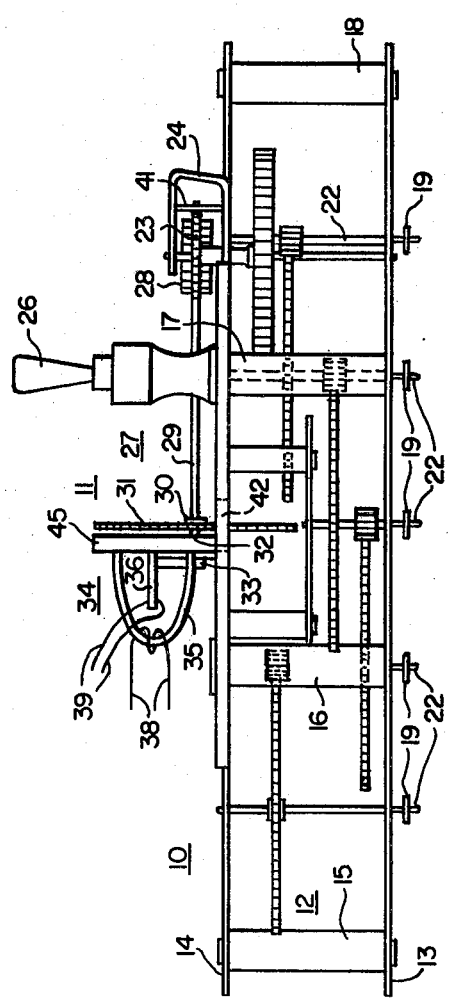
FIG. 1 is a front view with parts broken away of a meter totalizing device including a dial register assembly and an electromagnetic drive system mounted to the back thereof, the device made in accordance with a preferred embodiment of the present invention.
Figure 3:
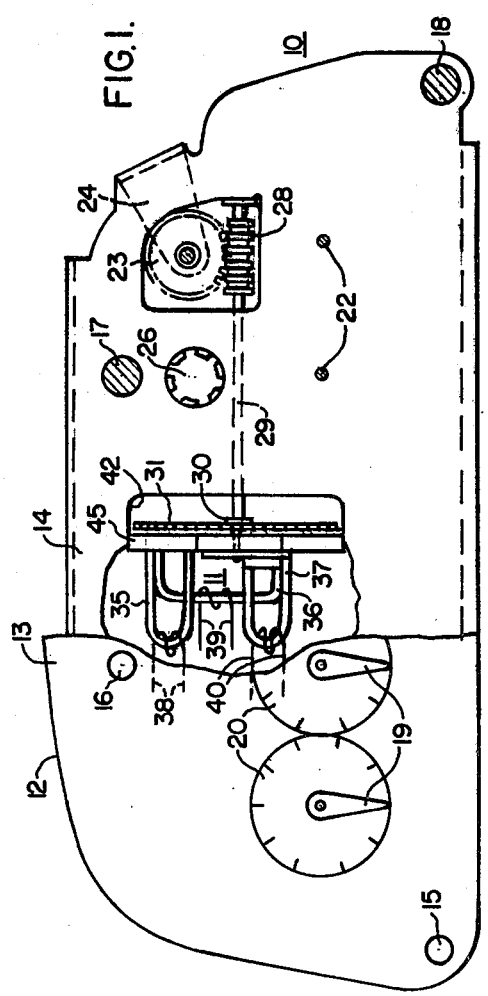
FIG. 3 is a top view of the device shown in FIG. 1.
Figure 4:
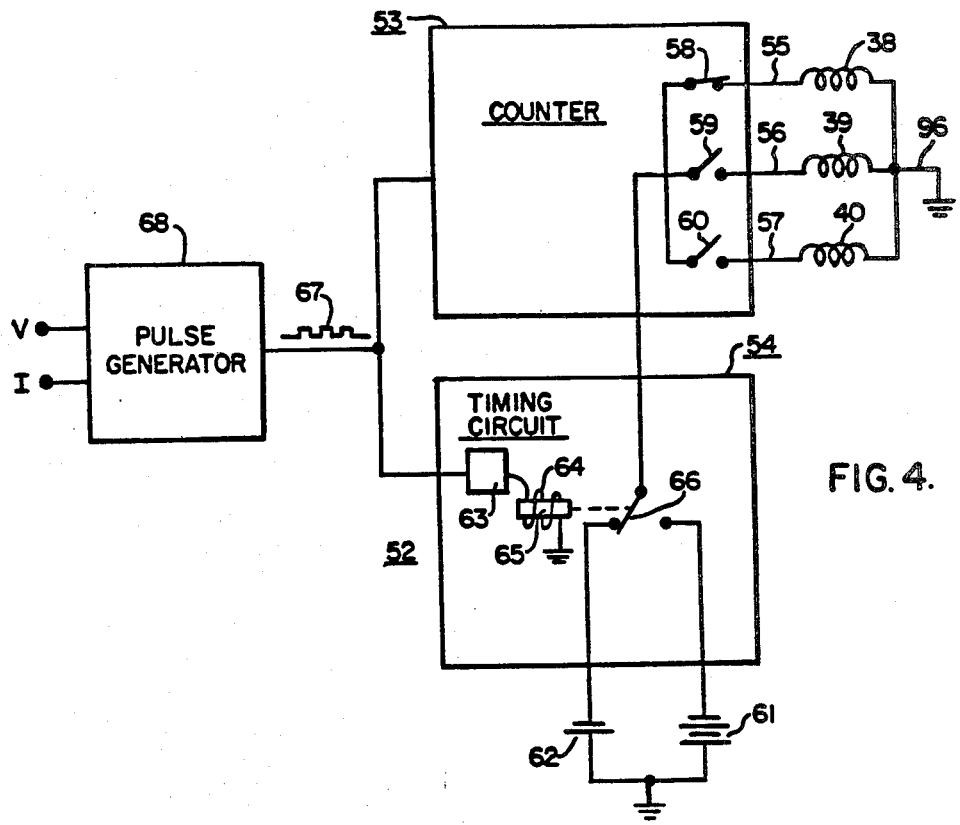
FIG. 4 is a circuit diagram of a sequence control circuit that responds to pulse signals and connects two power sources to the coil windings shown in FIGS. 1 or 6.

Referring now to the drawings and more particularly to FIGS. 1, 2, and 3, there is shown a preferred embodiment of an electrically driven meter totalizing device 10 for totalizing the value of a variable quantity measured by a consumption meter, not shown. In general, the meter totalizing device 10 includes an electromagnetic drive system 11 coupled to a dial register assembly 12. The drive system 11 is an important feature of the present invention, its energization being controlled by a pulse responsive sequence control circuit 52 as shown in FIG. 4. The dial register assembly 12 is a device well known to one skilled in the art.

The dial register assembly 12 includes a front plate 13 fastened to a back plate 14 by spacer studs 15, 16, 17 and 18, viewed best in FIGS. 2 and 3, with rotatable dial indicators 19 sweeping across the face of dials 20 which are disposed on the front plate 13. Between the front plate 13 and the back plate 14 is a gear train 21, with gear shafts 22 for rotating the dial indicators 19. A rotatable input, such as an input gear 23, is coupled to the gear train 21 and is mounted to the back plate 14 by a gear flap 24. Mounting bayonets 26 extend from the outside of the back plate 14 for detachably mounting the device 10 to the frame of a watthour meter, not shown, if the device is used to measure electric energy consumption.

The electromagnetic drive system 11 as shown in FIG. 3 includes a rotor 27 having a worm gear 28, a drive shaft 29, a shaft collar 30, an armature 31, a guide shaft 32 and a thrust bearing 33. The system 11 further includes a stator 34 having U-shaped electromagnetic pole pieces 35, 36 and 37 with coil windings 38, 39 and 40 carried thereon. The drive shaft 29 is mounted on the outside of the back plate 14 by a support bracket 41 and at one end carries the worm gear 28 meshed with the input gear 23. The other end of the drive shaft 29 carries the armature 31, which is mounted for rotation by the shaft collar 30 and is disposed as shown in FIG. 1 in a rotor opening 42 in the back plate 14.

Figure 5:
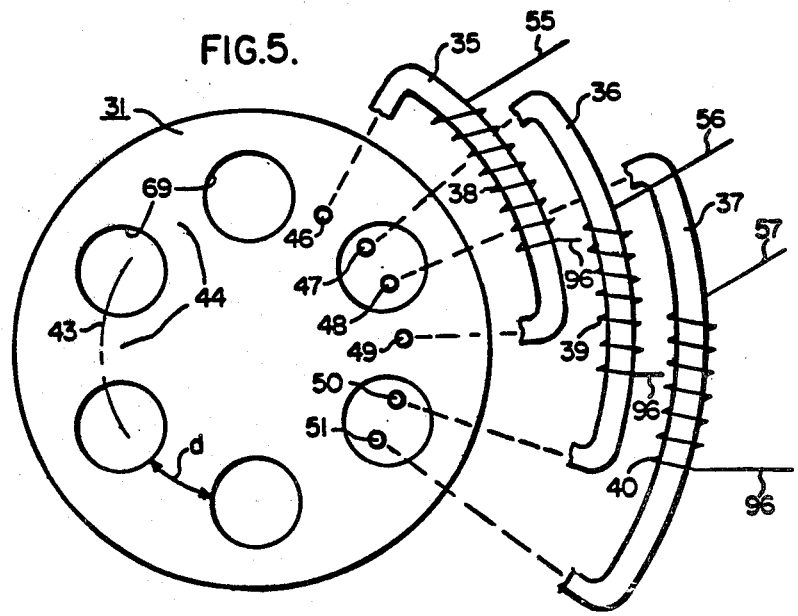
FIG. 5 is a diagrammatic illustration of an armature with the arrangement of the electromagnetic pole pieces and their coil windings as shown in FIG. 2.

The configuration of the armature 31 is best illustrated in FIG. 5. The armature 31 is a thin magnetic disc with circular openings 69 equally spaced along a circular reference axis 43. The arcuate distance between the circumference of adjacent openings, as measured along the reference axis 43 and shown by the line d, is equal to the radius of the openings 69. The webbed portions of the armature 31 that are disposed along the circular reference axis 43 are magnetic segments 44, the ends of the segments 44 defining the openings 69. Referring back to FIGS. 1, 2 and 3, the armature 31 is aligned by the guide shaft 32 with a support flap 45 which extends outward from the back plate 14 from one edge of the rotor opening 42 and is parallel and adjacent to the armature 31. The guide shaft 32 rotates in the thrust bearing 33 which is mounted on the support flap 45.

The electromagnetic pole pieces 35, 36 and 37 are mounted with their ends disposed in corresponding holes in the support flap 45 and adjacent the circular reference axis 43 of the armature 31 with the ends defining magnetic poles 46, 47, 48, 49, 50 and 51. The arrangement of the pole pieces 35, 36 and 37 and the spacing of the magnetic segments 44 and the openings 69 create a magnetically rotatably attractive relationship which will be more fully described hereinafter. The coil windings 38, 39 and 40 are carried on the pole pieces 35, 36 and 37 and are connected to the circuit 52 as illustrated in FIG. 4 and more fully described hereinbelow.

As noted above, FIG. 4 illustrates the circuit 52 which energizes the coil windings 38, 39 and 40. The FIG. 4 shows the sequence control circuit 52 which includes a control input having a counter circuit 53 and further having a switching means such as a timing circuit 54. The sequence control circuit 52 further includes outputs 55, 56 and 57 which connect the coil windings 38, 39 and 40 of FIG. 1 to the counter 53 and to the circuit ground 96. The counter 53 has switches 58, 59 and 60 which can be formed by solid state switching devices acting substantially like the mechanical switches shown by controlling the flow of current to coil windings 38, 39 and 40, respectively. The switches 58, 59 and 60 are connected to a first source of power such as a battery 61 and a second source of power such as a battery 62 by the timing circuit 54 which may be formed by a time delay circuit 63, a solenoid 64, a movable core 65 and a timing switch 66. The timing switch is normally biased in the position connecting the battery 61 to the switches 58, 59 and 60. The second battery 62 has a lower voltage than the first battery 61. The sequence control circuit 52 receives an input of pulse signals 67 from a pulse generating device 68, each pulse signal initiating a totalizing operation of the device 10.

If the present invention is used to totalize electric energy consumption, the pulse generating device 68 will respond to voltage V and current I components of the energy consumption, as shown in FIG. 4, each pulse representing a quantum of electric energy. In order to directly register electric energy consumption, the pulse generating device 68 can be formed in accordance with the electronic AC electric energy measuring circuit illustrates in U.S. Pat. No. 4,182,983, assigned to the assignee of this invention. In order to remotely register electric energy consumption the pulse generating device 68 can be formed in accordance with the watthour meter apparatus as described in U.S. Pat. No. 3,733,493 or as described in U.S. Pat. No. 3,943,498, both assigned to the assignee of this invention. The pulses 67 from the pulse generating device 68 can be expanded by an amplifying means not shown.

FIG. 5 illustrates the arrangement of the pole pieces 35, 36 and 37 of the device 10 of FIGS. 1, 2, and 3. The important feature in arranging the pole pieces 35, 36 and 37 is that a magnetically rotatably attractive relationship is created with the magnetic segments 44. This relationship is created by forming the stator 34 with one of the arrangements of the pole pieces 35, 36 and 37 that correctly corresponds to the size and shape of the magnetic segments 44 and the openings 69. A correct arrangement produces rotation of the armature 31 by positioning the pole pieces 35, 36 and 37 so that immediately after the fluxes produced from the ends of one of the pole pieces attracts a pair of magnetic segments 44, the ends of the pole piece that will next produce fluxes will be disposed to attract the same or another part of magnetic segments 44.

The armature 31 of the device 10 has six circular openings 69 with each one of the magnetic segments 44 disposed between one pair of adjacent openings. The number of openings 69 is limited only by spatial constraints and, as discussed hereinafter, the openings 69 need not be circular. To produce the above-described relationship, the magnetic poles 46, 47, 48, 49, 50 and 51 at the ends of the three U-shaped pole pieces are consecutively disposed and arcuately spaced apart a distance equal to the width of a magnetic segment 44 as shown by the line d. In this arrangement, the straight-line distance between the two ends of each pole piece 35, 36 and 37 is equal to the straight-line distance between the centers of adjacent magnetic segments 44. This is an important feature because to maintain the magnetically rotatably attractive relationship, the distance between the ends of a U-shaped pole piece must always be equal to one of the straight-line distances between two of the magnetic segments 44 so that the magnetic segments 44 will cover both pole piece ends at the same time.

Since the openings 69 in the armature 31 are circular, each semicircular half of the openings 69 is juxtaposed with one of the magnetic segments 44, the halves disposed on either side of a radius drawn from the center of the armature 31. As each coil winding 38, 39 and 40 is energized, each end of the pole piece that will next produce fluxes is disposed adjacent one of these semicircular halves along the reference axis 43 and in a plane parallel to the plane of the armature 31. This places the pole piece end closer to one of the two magnetic segments 44 which the pole piece end is disposed between, causing the fluxes produced from the pole piece end to attract the closer magnetic segment 44. The closer one of the magnetic segments 44 is disposed from the pole piece end in the direction opposite the desired direction of rotation so that the fluxes will attract the segment in the desired direction. It should be noted that since the openings 69 are circular, at least three pole pieces must be used to accomplish rotation of the armature 31 because after a pole piece attracts a magnetic segment 44, at least two more stepped rotations of the armature are needed to place the pole piece end close to another magnetic segment 44 as described hereinabove.

The operation of the embodiment of the present invention shown in FIGS. 1, 2, and 3 will now be described. When pulse signals 67 are received by the sequence control circuit 52, the coil windings 38, 39 and 40 are discretely energized in a repeating sequence by the counter 53 controlling the switches 58, 59 and 60 of the outputs 55, 56 and 57, each pulse effecting the energization of one coil winding. As each coil winding 38, 39 and 40 is energized, magnetic fluxes are generated at the corresponding electromagnetic pole piece 35, 36 and 37. FIG. 5 shows the coil winding 38 being energized by the battery 62 as shown in FIG. 4, the switch 58 being in the closed position. When the next pulse 67 is received by the sequence control circuit 52 from the pulse generating device 68, the switch 58 is opened, de-energizing the coil winding 38 and the switch 59 is closed, energizing the coil winding 39. At the same time the timing switch 66 is in the normally biased position, connecting the battery 61 with the counter 53. This causes the armature 31 to rotate clockwise one step so that magnetic segments 44 cover the ends of the pole piece 36. If a pulse 67 is not received by the sequence control circuit 52 within a predetermined amount of time as measured from when the preceding pulse was received, the solenoid 64 is energized by the time delay circuit 63, actuating the movable core 65 and causing the timing switch 66 to connect the battery 62 with the counter 53 and the outputs 58, 59 and 60. As subsequent pulses 67 are received, the coil windings 38, 39 and 40 are energized in sequence and as described hereinabove, producing a stepped rotation of the armature 31. In the procedure described above, the timing circuit 54 provides the required amount of voltage and current from the battery 61 for initially attracting magnetic segments 44. If the next pulse 67 is not received within the predetermined amount of time, the timing circuit 54 provides a lower voltage and current from the battery 62 for magnetically holding the armature 31 in a fixed position between pulses 67. This feature provides stability to the present invention while using a minimal amount of electrical current and power.

The stepped rotation of the armature 31 rotates the drive shaft 29 which drives the input gear 23. The rotation of the input gear 23 is imparted to the gear train 21 which rotates the totalizing dial indicators 19 in a decade-related fashion. It should be noted that energizing the coil windings in the sequence of coil winding 38, coil winding 40 and then coil winding 39 will cause a counterclockwise rotation of the armature 31 as viewed in FIG. 5.

Figure 7:
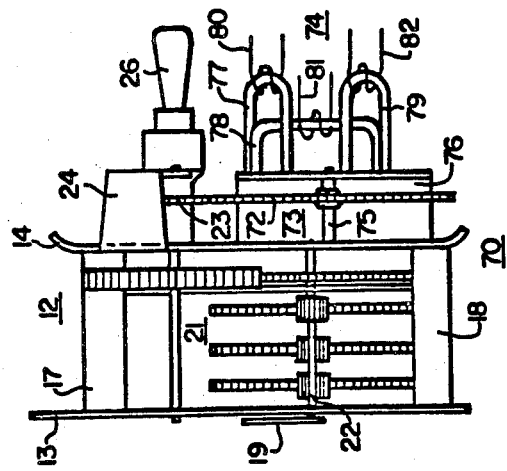
FIG. 7 is a side view of the device shown in FIG. 6.
Figure 6:
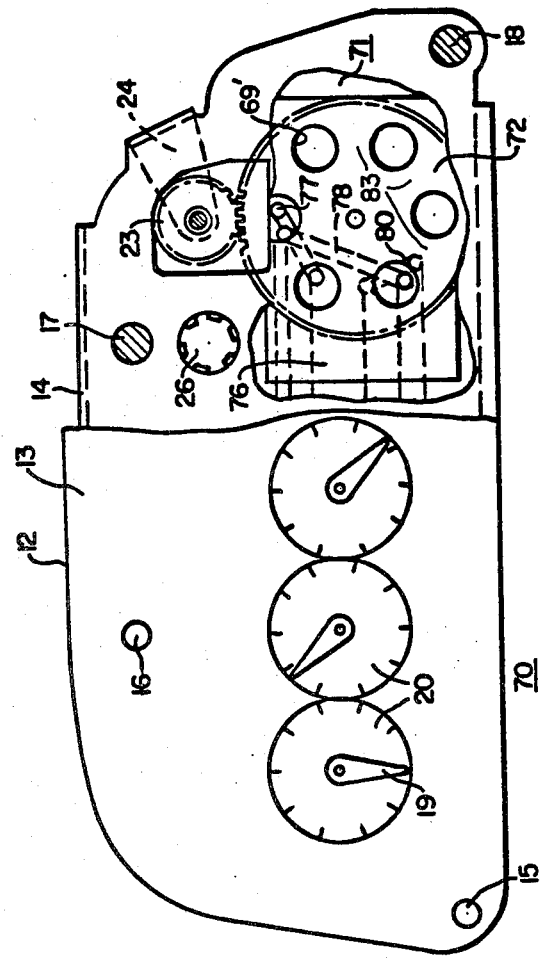
FIG. 6 is a front view with parts broken away of an alternative meter totalizing device including a dial register assembly and an electromagnetic drive system mounted on the back thereof, the alternative device being made in accordance with a second preferred embodiment of the present invention.

Another preferred embodiment of the present invention includes an alternative totalizing device 70 shown in FIGS. 6 and 7. The same numerals are used to correspond to the same or substantially similar elements as shown in FIGS. 1, 2 and 3 for the previously described device 10. The important difference between the two embodiments is the position of an electromagnetic drive system 71 in relation to the dial register assembly 12. In the device 70 of FIGS. 6 and 7 the electromagnetic drive system 71 has an armature 72 directly meshed with the input gear 23, whereas in the previously described device 10 the armature 31 is carried on a drive shaft 29 which also carries a worm gear 28, the worm gear being meshed with the input gear 23.

In the device 70, as in the previously described device 10, the electromagnetic drive system 71 includes a rotor 73 and a stator 74. The rotor 73 has an armature 72 and a guide shaft 75. The armature 72 is parallel to the back plate 14 of the dial register assembly 12, having gear teeth disposed along its circumference and meshed with the input gear 23. The armature 72 is a thin magnetic disc with circular openings 69' disposed along a circular reference axis 43. The guide shaft 75 is mounted to the back plate 14 and carries the armature 72 for rotation. The stator 74 is mounted on a support flap 76 and has U-shaped electromagnetic pole pieces 77, 78 and 79 with coil windings 80, 81 and 82 carried thereon. The support flap 76 extends outward from the back plate 14 in an L-shaped configuration if viewed from below. The electromagnetic pole pieces 77, 78 and 79 have their ends mounted in the support flap 76 in a substantially similar manner as previously described for the device 10 shown in FIGS. 1, 2, and 3.

Figure 8:
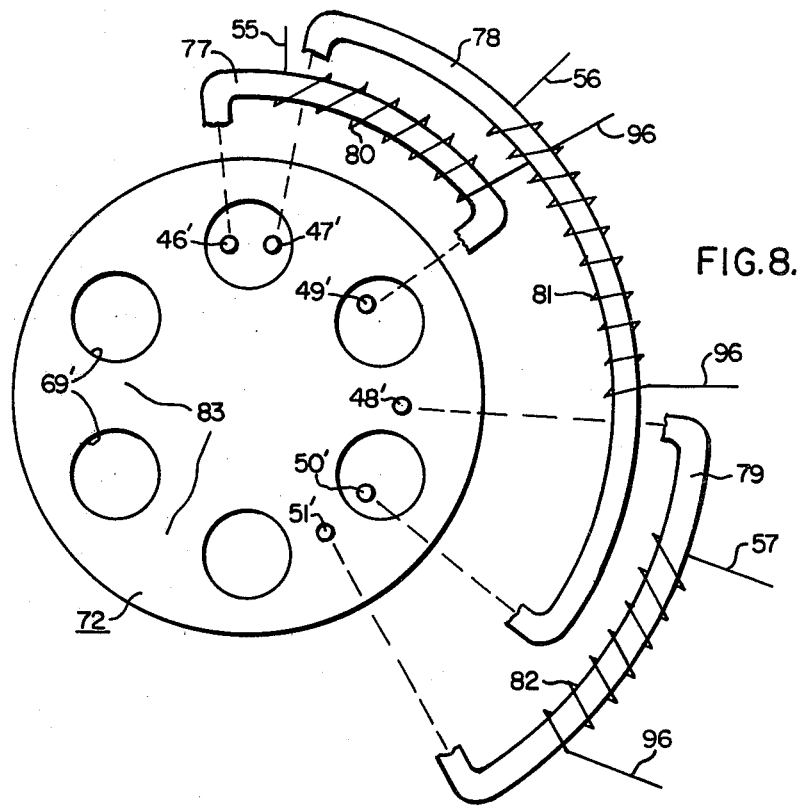
FIG. 8 is a diagrammatic illustration of an armature with the arrangement of electromagnetic pole pieces and their coil windings as shown in FIG. 6.

The arrangement of the pole pieces 77, 78 and 79 of the alternative device 70 is different from the previously described device 10. However, the shape, size and spacing of magnetic segments 83 and the openings 69' are the same and the modified arrangement of the pole pieces 77, 78 and 79 maintains the magnetically rotatably attractive relationship as previously described. This modified arrangement is illustrated in FIG. 8.

The operation of the device 70 will now be described. The device 70 is connected to the circuit 52 shown in FIG. 4. One operative position of the device 70 is shown in FIG. 8 wherein the coil winding 82 is energized. In general, as each pulse signal 67 is received, a coil winding is energized and the preceding coil winding de-energized by the counter 53 in the repeating sequence of coil winding 80, coil winding 81 and coil winding 82, with the same operation of the timing circuit 54 of FIG. 4 as previously described for the device 10. This repeating sequence causes a clockwise stepped rotation of the armature 72 by attracting the magnetic segments 83. This rotation is translated to the input gear 23 which in turn drives the gear train 21 and dial indicators 19 in the same manner as previously described for the device 10. It should be noted that the arrangements of the pole pieces 35, 36 and 37 and 77, 78 and 79 shown in FIGS. 5 and 8, respectively, are not unique to the placement of the electromagnetic drive systems 11 and 71 as shown in the corresponding FIGS. 1 and 6. In addition to maintaining a magnetically rotatably attractive relationship as previously described, the major considerations for choosing the arrangement of the electromagnetic pole pieces are the spatial constraints and the ease of manufacture and assembly.

Figure 9:
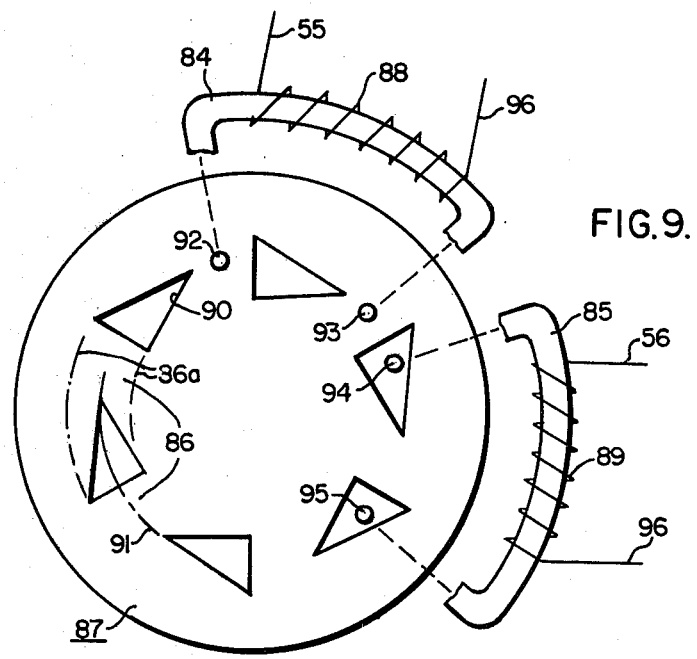
FIG. 9 is a diagrammatic illustration of still another preferred embodiment of an armature of the present invention along with the arrangement of the electromagnetic pole pieces and their coil windings.

FIG. 9 shows an alternative armature 87 which is intended to replace either the armature 31 or the armature 72 of the devices 10 and 70, respectively. The ends of magnetic segments 86 of an armature 87 define triangular openings 90. To better illustrate the magnetic segments 86, the sides of one of the segments are shown by the parallel lines 86a in FIG. 9. The openings are tapered along a circular reference axis 91 opposite the desired direction of rotation. The desired direction of rotation is counterclockwise as viewed in FIG. 9.

To provide the magnetically rotatably attractive relationship as previously described, only two electromagnetic pole pieces 84 and 85 are required rather than the three pole pieces 35, 36 and 37 that are required for an armature 31 with circular openings 69 as described hereinbefore. The distance between the ends of each pole piece 84 and 85 is equal to the straight-line distance between the center of any two magnetic segments 86, which are adjacent along the axis 91. Coil windings 88 and 89 are carried on the pole pieces 84 and 85 and connected by the outputs 55 and 56 to a sequence control circuit such as the one shown in FIG. 4. The counter 53 is modified to use only two outputs 55 and 56 to alternate the energization of the pole pieces 84 and 85 as each pulse 67 is received by the sequence control circuit 52.

In the armature 87 the important feature in providing the magnetically rotatably attractive relationship is the tapering of the openings 90 in the direction opposite the desired direction of rotation. The ends 94 and 95 of the pole piece 85 which carries an unenergized coil winding 89 are oriented closer to the areas of magnetic segment 86 that are disposed along the tapered sides of the opening 90 than to the wide end of the segment disposed on the other side of the opening 90. Since the closer magnetic segments are disposed relative to the pole piece ends 94 and 95 in the direction opposite the desired direction of rotation, the flux produced from the ends 94 and 95 attracts the closer magnetic segments 86 in the desired direction. Thus, when only two pole pieces 84 and 85 are used, the tapering of the openings 90 provides rotation of the armature 87 in the desired direction.

For operation of a meter totalizing device including the armature 87, the coil winding 89 is energized by the output 56, with the fluxes produced from the pole piece ends 94 and 95 attracting the closer magnetic segments 86. The armature 87 rotates and the ends 92 and 93 of the pole piece 84 are then in a similar position with respect to a pair of magnetic segments 86. The alternate energization of the coil windings 88 and 89 by the counter 53, shown in FIG. 4 and modified as discussed hereinbefore, produces stepped rotation of the armature 87. The rotation is translated to a dial register assembly 12 for totalizing the consumption of a measured quantity as previously described for the devices 10 and 70.

The electrically driven motor totalizing device described hereinabove will provide an efficient and simple method of totalizing the value of a variable quantity. It is contemplated that modifications and changes to the preferred embodiments will be apparent to those skilled in the art without departing from the spirit and scope of the invention.

I claim:

1. An electrically driven meter totalizing device responsive to pulse signals comprising:
    a dial register assembly including a front plate, a back plate, a gear train, a plurality of dial indicators, and a rotatable input, said gear train being carried for rotation between said front plate and said back plate and coupling said dial indicators adjacent said front plate, said rotatable input being carried adjacent said back plate and being in driving relationship with said gear train;
    circuit means including a plurality of outputs, said outputs being discretely energized in a repeating sequence and in response to said pulse signals;
    an electromagnetic drive system including a rotor mounted for rotation on said back plate and being in driving relationship with said rotatable input, said rotor having an armature including at least three radially disposed evenly spaced equal magnetic segments, said magnetic segments being rotatable along a circular reference axis, said electromagnetic drive system further including a stator attached to said back plate, said stator having a plurality of electromagnetic pole pieces and further having a plurality of coil windings, each of said coil windings carried on one of said pole pieces and connected to one of the outputs of said circuit means for producing magnetic fluxes from the pole piece ends, said pole piece ends being adjacent said circular reference axis and defining magnetic poles, said pole pieces fixedly spaced in a magnetically rotatably attractive relationship with said magnetic segments so that immediately after the fluxes produced from the ends of one of said pole pieces attracts at least one of said magnetic segments, causing rotation of said armature, the ends of the pole piece that will next produce fluxes will be disposed to attract at least another one of said magnetic segments.

2. An electrically driven meter totalizing device as claimed in claim 1 wherein the ends of said magnetic segments define at least three circular openings in said armature, said openings evenly spacing said magnetic segments along said circular reference axis, the arcuate distance as measured along said circular reference axis between the circumference of adjacent openings being substantially equal to the radius of said openings, and wherein said stator includes three U-shaped electromagnetic pole pieces.

3. An electrically driven meter totalizing device as claimed in claim 1 wherein the ends of said magnetic segments define at least three triangular openings in said armature, said openings evenly spacing said magnetic segments along said circular reference axis, wherein each of said openings is tapered along said reference axis opposite the direction of the desired rotation of said rotor, and wherein said stator includes two U-shaped electromagnetic pole pieces.

4. An electrically driven meter totalizing device as claimed in claim 1 wherein said armature is a thin disc mounted for rotation on said back plate and having gear teeth disposed along the circumference of said disc, said gear teeth directly meshed with said rotatable input.

5. An electrically driven meter totalizing device as claimed in claim 1 wherein said rotor includes a shaft mounted on said back plate, said shaft carrying a gear meshed with said rotatable input and further carrying said armature disposed for rotation.

6. An electrically driven meter totalizing device as claimed in claim 1 wherein said circuit means includes a plurality of outputs, each of said outputs connected to one of said coil windings, said circuit means further including a control input with counter means for allowing said sequential energization of said coil windings in response to said pulse signals received at said control input.

7. An electrically driven meter totalizing device sequentially energized by first and second power sources in response to pulse signals, each pulse signal representing a predetermined quantum of a quantity to be measured comprising:

a dial register assembly including a front plate, a back plate, a gear train, a plurality of dial indicators and an input gear, said gear train being carried for rotation between said front plate and said back plate and coupling said dial indicators adjacent said front plate, said input gear disposed at said back plate and being in driving relationship with said gear train;

an electromagnetic drive system including a rotor meshed with said input gear, said rotor having a shaft-mounted armature made of thin magnetic material, said armature including at least three similar circular openings substantially equally spaced along a circular reference axis, the arcuate distance as measured along said reference axis between the circumference of any two adjacent openings being substantially equal to the radius of said openings, said electromagnetic drive system further including a stator having first, second and third U-shaped pole pieces mounted on said back plate, the ends of said pole pieces defining pairs of magnetic poles for directing fluxes through said armature, each of said poles of said first, second and third pole pieces being consecutively disposed adjacent said circular reference axis, said poles being arcuately evenly spaced along said reference axis a distance substantially equal to the radius of said circular openings, first, second and third coil windings being carried on said first, second and third pole pieces, respectively; and a sequence control circuit including first, second and third outputs connected to said first, second and third coil windings, respectively, said sequence control circuit further including a control input having a counter means for allowing individual energization of each of said first, second and third coil windings in a predetermined repeating sequence that responds to each of said pulse signals so that the magnetic fluxes imparted to said pole pieces and directed from said magnetic poles produce stepped rotation of said armature, said control input further having a switching means for changing the energization of each of said coil windings from said first power source to said second power source, said second power source supplying a smaller amount of power than said first power source for holding said armature in a fixed position between inputs of said pulse signals.

8. An electrically driven meter totalizing device as claimed in claim 7 wherein each of said pulse signals represent a quantum of electric energy consumption.

* * * * *